US006222759B1

United States Patent
Chi-Hung

(10) Patent No.: US 6,222,759 B1
(45) Date of Patent: Apr. 24, 2001

(54) METHOD OF DETERMINING COUPLING RATIOS IN A SPLIT-GATE FLASH DEVICE

(75) Inventor: Kao Chi-Hung, Taipei (TW)

(73) Assignee: Winbond Electronics Corporation, Hsinchu (TW)

( * ) Notice: Subject to any disclaimer, the term of this patent is extended or adjusted under 35 U.S.C. 154(b) by 0 days.

(21) Appl. No.: 09/457,358

(22) Filed: Dec. 9, 1999

(51) Int. Cl.$^7$ .................................................. G11C 16/04
(52) U.S. Cl. .................................... 365/185.01; 365/185.1
(58) Field of Search ...................... 365/185.26, 185.24, 365/185.14, 185.1, 185.01

(56) References Cited

U.S. PATENT DOCUMENTS

| | | | | |
|---|---|---|---|---|
| 5,268,318 | * | 12/1993 | Harari | 437/43 |
| 5,835,409 | * | 11/1998 | Lambertson | 365/185.15 |
| 6,005,809 | * | 12/1999 | Sung et al. | 365/185.29 |
| 6,058,043 | * | 5/2000 | Houdt et al. | 365/185.14 |

OTHER PUBLICATIONS

Noren et al., "Macromodel Development for a FLOTOX EEPROM," IEEE Transactions on Electron Devices (Jan. 1998), 45:224–229.

Brown et al., "Nonvolatile Semiconductor Memory Technology," Institute of Electrical and Electronics Engineers, Inc. (1998), pp. 54–60.

Wong et al., "Analysis of the Subthreshold Slope and the Linear Transconductance Techniques for the Extraction of the Capacitance Coupling Coefficients of Floating–Gate Devices," IEEE Electron Device Letters (Nov. 1992), 13:566–568.

San et al., "A New Technique for Determining the Capacitive Coupling Coefficients in Flash EPROM's," IEEE Electron Device Letters (Jun. 1992), 13:328–331.

Bellezza et al., "A New Self–Aligned Field Oxide Cell for Multimegabit EPROMS," International Electron Devices Meeting (1989), pp. 579–582.

Mitchell et al., "A New Self–Aligned Planar Array Cell for Ultra High Density EPROMS," International Electron Devices Meeting (1987), pp. 548–551.

* cited by examiner

Primary Examiner—David Nelms
Assistant Examiner—Thong Le
(74) Attorney, Agent, or Firm—Finnegan, Henderson, Farabow, Garrett & Dunner, L.L.P.

(57) ABSTRACT

A method of determining a coupling ratio of a split-gate memory cell includes initializing the cell, placing the cell in a reverse operation mode, sweeping a control gate voltage of the cell, measuring a source voltage of the cell, and determining the coupling ratio of the memory cell. The initializing can include substantially fully charging a floating gate of the cell. In that case, the measuring occurs while the floating gate is substantially fully charged. The determining can include the determination of two coupling ratios of the split-gate memory cell. To determine the two coupling ratios, a first function is defined having three unknown variables, the two coupling ratios being two of the unknown variables, and a second function is defined where only the two coupling ratios are unknown variables. By solving for the first function and second function using the measurement, the two coupling ratios are determined. The coupling ratios can be used to develop an accurate equivalent model of the split-gate cell.

20 Claims, 8 Drawing Sheets

METHOD OF DETERMINING COUPLING RATIOS IN A SPLIT-GATE FLASH DEVICE

BACKGROUND OF THE INVENTION

1. Field of the Invention

The present invention relates to modeling the characteristics of a semiconductor device. More particularly, the invention relates to modeling characteristics of an electrically-erasable programmable read-only memory (EEPROM).

2. Description of the Related Art

An electrically erasable programmable read-only memory (EEPROM) is an electronic memory device that stores information in the form of the presence or absence of electronic charge on a floating gate.

The gate is "floating" because it is surrounded by an insulating material, and no electrical contact is made to it. Thus, charge placed on the floating gate will remain and will not leak off the gate over time, even when power to the device is removed. Accordingly, this type of memory is nonvolatile. To place charge on the floating gate, the device must perform a programming sequence that forces charge across the insulating material.

EEPROM cells can take various forms. One such form is a "split gate" cell that is characterized by an overlapping arrangement of a control gate and the floating gate. With this arrangement, both the control gate and the floating gate have a strong influence on electron flow from the device's source to its drain. Another form is a double-poly single-transistor erasable tunnel oxide (ETOX) cell, which uses two gates aligned vertically, so that the control gate is spaced far apart from the device body.

Routines to program, erase, and read an EEPROM are well-known. For example, one such routine programs the cell (or performs a write operation) by placing a negative charge on the floating gate by hot electron injection. Hot electron injection involves raising a drain (D) voltage relative to a source (S) voltage to a sufficiently positive value. Then, the control gate (CG) voltage is raised relative to the source voltage to a sufficiently positive value. This causes electrons to flow in the channel under the control gate and the floating gate, from source to drain. The electric field set up by the control gate attracts these elections. Because of the high drain voltage, the electrons are very energetic, i.e., "hot." Some of the hot electrons are energetic enough to cross the thin insulating oxide under the floating gate. As a result, electrons are injected onto the floating gate.

Erasing, or removing, charge from the floating gate involves the steps of raising the substrate "body" (B) voltage to a sufficiently positive value and grounding the source, control gate, and drain. The electric field set up by the body voltage causes electron flow from the floating gate to the substrate.

After charge is placed on or removed from the cell, the cell is read to determine its state. When reading the cell, voltages are applied to the cell in the manner of an ordinary MOSFET. Accordingly, positive voltages, which are smaller in magnitude than the programming/writing or erasing voltages, are put on the drain and control gate and the amount of current that flows from source to drain is measured.

The absence of charge on the floating gate is typically assigned to be a high logic state, e.g., a "1". In this state, the cell is fully conductive. On the other hand, when charge is present on the floating gate, the cell will be less conductive during a read operation. The presence of charge on the floating gate is typically assigned to be a low logic state, e.g., a "0". In this state, the cell is partially, or completely, non-conductive.

The cell could also be programmed in a multi-bit manner. In such a multi-bit programming scheme, the amount of charge on the floating gate will set the cell in one of more than 2 states.

The operational characteristics of an EEPROM cell depend primarily on geometrical factors, for example, the distances between the electrodes. After a device is constructed, the geometry of the device is difficult to measure.

When designing a conventional EEPROM, measurements of capacitance have been used as a proxy for direct physical measurements. Capacitance measurements can be interpreted to provide an indication of the physical dimensions of the device and, thus, the actual electronic performance of the device. Typically, the measurements are used to determine "coupling capacitances," which describe the influence of an electrode on another electrode. Ratios of these capacitances, known as coupling ratios, may also be used to describe an EEPROM cell. These coupling ratios not only help to monitor the floating gate but also provide an indication of the voltage drop between a gap region, which is a weak control region between control gate and floating gate, and the floating gate. Once the electronic performance of the device is modeled, the model can be used to determine the voltage of the floating gate, something that cannot be done with a direct measurement.

Conventional design programs, such as HSPICE, used in conjunction with determined coupling ratios are used to model a device. With an accurate model, cell design can be enhanced, thereby preventing malfunction. Accordingly, a device could then be designed with a small safety tolerance.

SUMMARY OF THE INVENTION

Accordingly, the present invention is directed to a model for the characteristics of a semiconductor device, a cell designed using such a model, and a method for modeling such characteristics that substantially obviate one or more of the problems due to limitations and disadvantages of the prior art. To achieve these and other advantages and in accordance with the purpose of the invention, as embodied and broadly described herein, the invention comprises a method of determining characteristics of a split-gate memory cell, including substantially fully charging a floating gate, measuring a parameter of the memory cell while the floating gate is substantially fully charged, and determining a characteristic of the memory cell based on the measurement.

In another aspect, the present invention provides a method of determining a characteristic of a split-gate memory cell, including initializing the memory cell, placing the memory cell in a reverse operation mode, sweeping a control gate voltage of the cell, measuring a source voltage of the cell, and determining the characteristic of the memory cell.

Also, the present invention provides a method of determining two characteristics of a split-gate memory cell, including defining a first function having three unknown variables, the two characteristics being two of the unknown variables, defining a second function where only the two characteristics are unknown variables, measuring a first device parameter relative to a second device parameter to determine the remaining unknown variable of the first function, and solving for the first function and second function using the measurement to determine the two characteristics.

Additional advantages of the invention will be set forth in part in the description which follows, and in part will be obvious from the description, or may be learned by practice of the invention. The advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate the embodiments of the invention and together with the description, serve to explain the principles of the invention.

DESCRIPTION OF THE PREFERRED EMBODIMENT

Reference will now be made in detail to an exemplary embodiment of the invention, which is illustrated in the accompanying drawings. Wherever appropriate, the same reference numbers will be used throughout the drawings to refer to the same or like parts.

Figure 1:
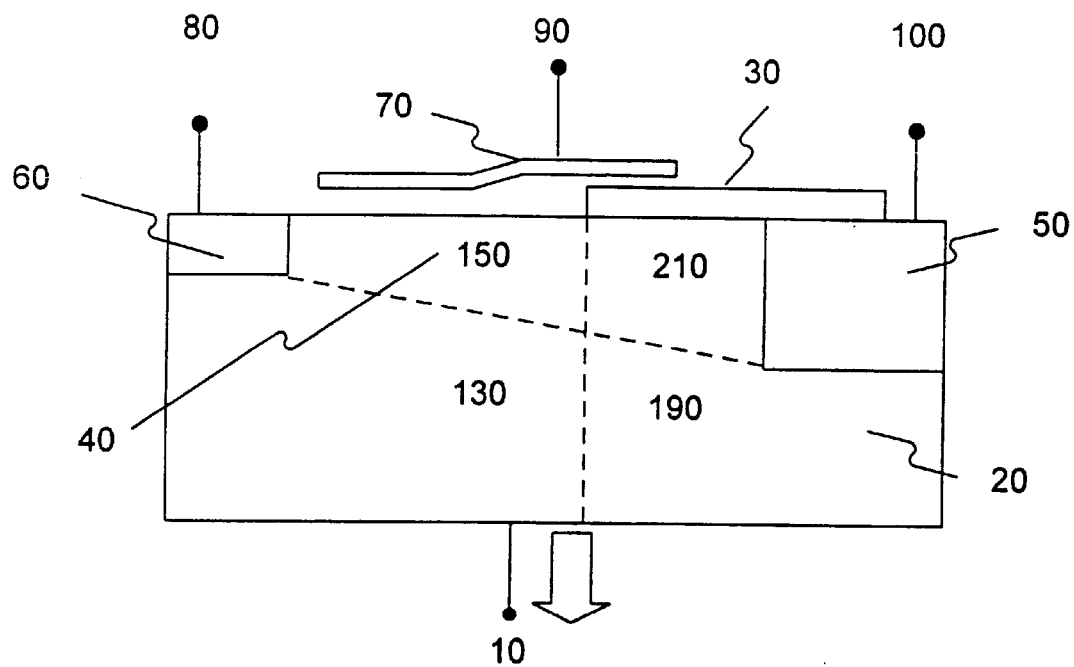
FIG. 1 is a schematic view of a cross section of an EEPROM consistent with the present invention.

An EEPROM cell in accordance with the present invention can have a split-gate architecture as shown in FIG. 1. The EEPROM cell can be provided in a memory array with other same-structure EEPROM cells to provide a flash memory architecture where erasing is performed only in blocks or on the entire array, thereby permitting programming to be performed with an array that is installed in an integrated circuit. A body electrode 10 is connected to a substrate 20 and is typically grounded. A floating gate 30 is disposed above a channel region 40 between a source region 50 and a drain region 60. A control gate region 70 overlaps floating gate 30 and channel region 40. With this arrangement, both floating gate 30 and control gate region 70 have a strong influence on electron flow through channel region 40. Electrodes 80, 90, and 100 are provided on drain region 60, control gate region 70, and source region 50, respectively, to supply appropriate voltages to the regions.

Figure 2:
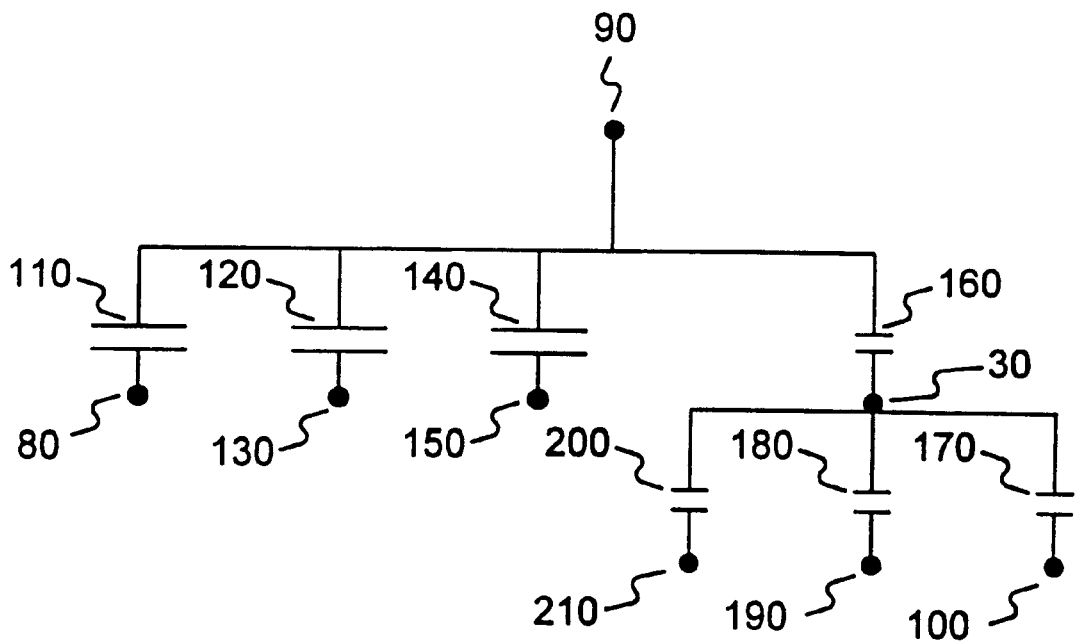
FIG. 2 is circuit diagram illustrating an equivalent capacitive circuit consistent with the present invention.

The EEPROM shown in FIG. 1 can be modeled by an equivalent capacitive circuit. As shown in FIG. 2, one such equivalent circuit includes a capacitance 110 between control gate electrode and drain region electrode 80, $C_D$, and a capacitance 120 between control gate electrode 90 and a portion 130 of substrate 20, $C_{SUB1}$. Portion 130 is defined as a non-channel portion of the substrate under the part of control gate region 70 that does not overlap floating gate 30. Further, the equivalent circuit includes a capacitance 140 between control gate electrode 90 and a portion 150 of channel region 40 under the floating gate 30, $C_{GC1}$, and a capacitance 160 between control gate electrode 90 and floating gate 30, $C_{FG}$.

Still further, the equivalent circuit of FIG. 2 includes a capacitance 170 between floating gate 30 and source region electrode 100, $C_S$, and a capacitance 180 between floating gate 30 and a portion 190 of substrate 20, $C_{SUB2}$. Portion 190 is defined as a non-channel portion of substrate 20 under the floating gate 30 and channel 40. The equivalent circuit also includes a capacitance 200 between floating gate 30 and a portion 210 of channel region 40 under the floating gate 30, $C_{GC2}$.

HSPICE, or another circuit simulation program, can be programmed in accordance with the above capacitive circuit and, once the capacitive values are accurately determined, can be used to predict how the cell will react to operations of a cell, such as reading and writing.

To accurately determine the above capacitive values, the EEPROM can be connected to a measuring device for performing current and voltage measurements in a semiconductor device, such as the commonly-used measuring devices in Hewlett-Packard Model Series Nos. HP 4142/4145/4156. The EEPROM is preferably placed in a "dark" box, which is shielded from light to eliminate measurement perturbations. Micropositioners enable an operator or robot to make the required contacts to the EEPROM.

A number of coupling ratios affect the floating gate voltage in an EEPROM: the control gate to floating gate coupling ratio, $\alpha_G$, the source side to floating gate coupling ratio, $\alpha_S$, the drain to floating gate coupling ratio, $\alpha_D$, and the substrate to floating gate coupling ratio $\alpha_{SUB}$. Of these, the control gate to floating gate coupling ratio $\alpha_G$ and the source side to floating gate coupling ratio as have the greatest effect on the floating gate voltage. For split-gate EEPROM cells, the above four coupling ratios are the only ratios that apply. Other EEPROM structures have added ratios which apply.

For example, in the EEPROM equivalent circuit shown in FIG. 2, $C_T$ is the total floating gate capacitance (=$C_{FG}$+$C_S$+$C_{GC2}$+$C_{SUB2}$). Accordingly, the floating gate coupling ratios become:

$$\alpha_G = \frac{C_{FG}}{C_T}; \alpha_S = \frac{C_S}{C_T}; \alpha_{SUB2} = \frac{C_{SUB2}}{C_T}; \alpha_{GC2} = \frac{C_{GC2}}{C_T} \quad (1)$$

Because of the special process herein described, including substantially fully charging the floating gate of the EEPROM cell, that is programming the cell to a "0" state, and, thus, providing a high threshold voltage, the channel 40 is weakly inverted, which prevents substrate coupling. Therefore, the term $\alpha_{SUB2}$ can be neglected. Further, the coupling ratio $\alpha_{GC2}$ can be treated as negligible, as the channel 40 is not completely formed.

Using the non-negligible coupling ratios and the expression for total capacitance, a first linear equation is provided:

$$\alpha_G + \alpha_S = 1 \quad (2)$$

Since the first linear equation has only unknown variables $\alpha_G$ and $\alpha_S$, only two independent linear equations need to be used. The method according to the present embodiment provides a combination of equations that permits a circuit designer to determine the coupling ratios quickly and accurately. The first linear equation is valid when the substrate of the EEPROM of FIG. 1 is grounded.

The second linear equation is derived in the following manner. When the cell is used in a reverse operation mode, where a constant source current is forced into the cell, a relationship can be determined between changes in source voltage ($V_S$) and control gate voltage ($V_{CG}$) relative to the $\alpha_G$ and $\alpha_S$ coupling ratios, when considering a source current in the weak inversion region.

In the reverse operation mode, there is a negligible dependence of the source current on $V_S$ in the subthreshold region. The current can only be affected through the floating gate voltage, via the coupling ratio, and substrate, or back-gate, bias. The back-gate bias can be neglected if the back-gate (substrate) is held at ground potential. Therefore, the subthreshold current ($I_S$) and floating gate voltage ($V_{FG}$) can be expressed as:

$$I_S = I_o \exp[\beta(V_{FG} - V_T)]; \quad V_{FG} = \alpha_G V_{CG} + \alpha_S V_S + \frac{Q_{FG}}{C_T} \quad (3)$$

where $I_o$ is a constant, $\beta$ is q/nkT (q/kT being the inverse of thermal voltage, 25.9 mV), n is a number ranging from 1.5 to 3, $V_T$ is the threshold voltage, and $Q_{FG}$ is the charge on the floating gate. Substituting $V_{FG}$ and taking the natural log reduces equation (3) to:

$$\ln I_S - \ln I_G + \beta\left(\alpha_0 V_{CG} + \alpha_S V_S + \frac{Q_{FG}}{C_T} - V_T\right) \quad (4)$$

$$\Rightarrow V_S = V_O - \frac{\alpha_G}{\alpha_S} V_{CG} \cos; I_s, Q_{FG} \text{ and } V_T \text{ being constant} \quad (5)$$

In order to maintain $I_S$, $Q_{FG}$ and $V_T$ as constants the source current $I_S$ is maintained at a fixed value. Also, the cell is programmed to be in the "0" state, which ensures a high charge on the floating gate which repels incoming charge to ensure that $Q_{FG}$ and $V_T$ are maintained at constant values.

Taking a partial differential to the left-side of equation (5) with respect to variable $V_{CG}$ yields the second linear equation:

$$\Rightarrow S = \frac{\alpha_G}{\alpha_S} \quad (6)$$

where S is defined as:

$$S \equiv \frac{dV_S}{dV_G} \quad (7)$$

Figure 3A:
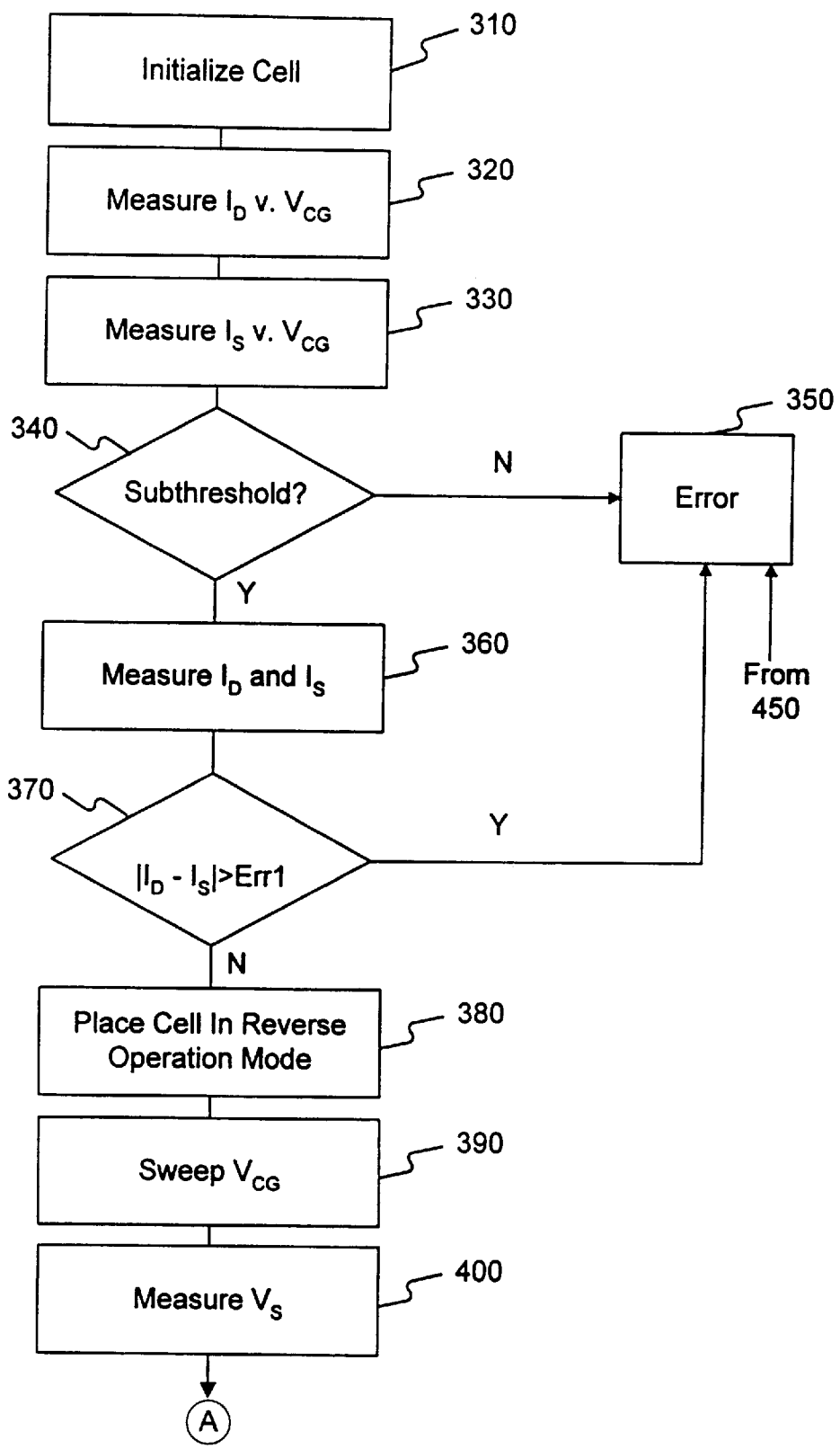
FIGS. 3A–3B are flow diagrams of a process to determine coupling ratios in a manner consistent with the present invention.
Figure 3B:
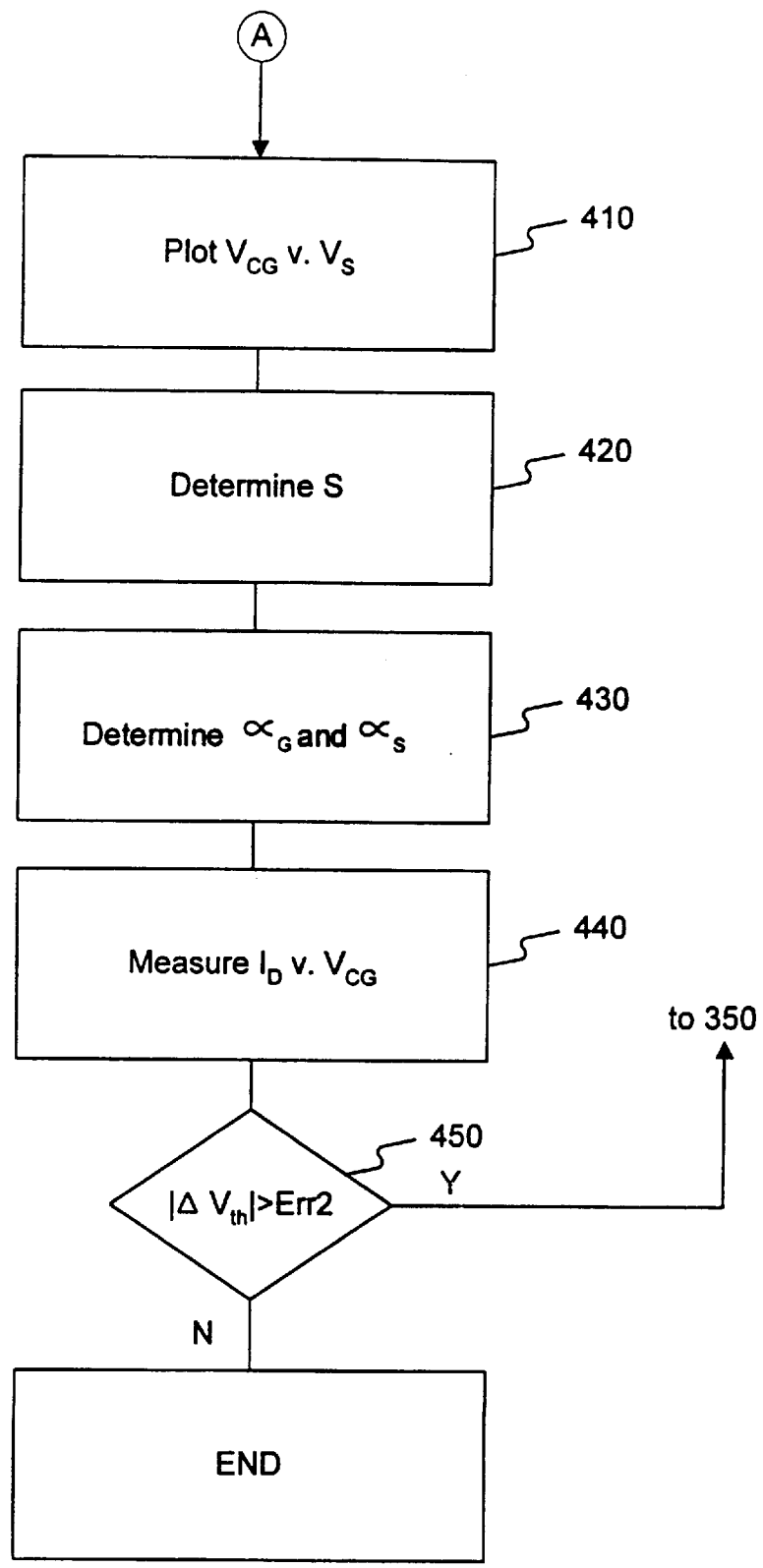

In accordance with a process according to the embodiment of the present invention, the value S, the ratio of coupling coefficients, is measured by a process that determines a rate of change of the voltage on the control gate with respect to that on the source. FIGS. 3A and 3B illustrate steps during a process to determine the coupling coefficients $\alpha_S$ and $\alpha_G$ using the linear equations according to the present invention.

An experimental example, as shown in FIGS. 4–7, will also be referenced in the context of the process.

To begin, the EEPROM cell is initialized by removing charge from the cell (Step 310). Thus, the cell is placed in a substantially fully-conductive state corresponding to a logic-high state, e.g., a "1" state. Then, the cell is substantially fully programmed to place a large amount of charge on the cell. In other words, the cell is placed in a logic-low state, e.g., a "0", by injecting a large amount of charge onto the floating gate to render the cell substantially non-conductive. This cycle of erasing and programming the cell prevents the occurrence of a soft program condition. Because there is a large amount of charge in the floating gate, further charge injection from a charging source current will be limited. Thus, with the cell substantially fully programmed, the charge on the floating gate, $Q_{FG}$ in Equation (3), will be nearly constant throughout the subsequent steps, as the full charge on the floating gate will significantly suppress any electron injection caused by the forcing current of the subsequent steps.

In the experimental example, the "0" state corresponds to a threshold voltage of 5.4V. To explain the effect of the full charge on the floating gate, using a logic "0" state in the experimental example, the threshold voltage shifts from 5.4V to 5.45V during the process of the experimental example. In comparison, the threshold voltage of the cell shifts from 0.9V to 2.2V when a logic "1" state is used, and the problem of electron injection can be very serious. Indeed, the large shift in threshold voltage could show a large electron injection into the floating gate, which in turn could cause the process to fail because $Q_{FG}$ will not be constant. Accordingly, the cell is preferably initialized in the "0" state.

After the cell is initialized, the threshold voltage of the cell is measured using a normal read operation (Step 320). In other words, $I_D$ versus $V_{CG}$ is determined to record the precise value of the device when fully-programmed.

Equations (1)–(7) remain valid when the sweep range of control gate voltage and the forcing current are in such a relationship that the cell is maintained in a subthreshold region. Thus, as the method maintains $V_{CG}$ at values below threshold, the threshold of the cell should be determined. To determine threshold using a measurement, $I_S$ versus $V_{CG}$ is measured in order to determine the value of $V_{CG}$ at which threshold occurs, which is indicated by a rapid rise of $I_S$, after the cell is initialized (Step 330). Alternatively, threshold can be determined approximately, as threshold ($V_{th}$) is defined as $V_{CG}$ (at the max.$_{gm}$)–½ $V_{DS}$. The transconductance gm is an index of the inversion charges responding to gate voltage charge. This transconductance gm will gradually increase to a maximum value as the gate voltage is increased, and then saturates and degrades in value. When $V_{CG} < V_{th}$, $I_S$ is a subthreshold current. If the cell is not operating in the subthreshold region (Step 340), the process is terminated and, an error is indicated (Step 350).

Figure 4:
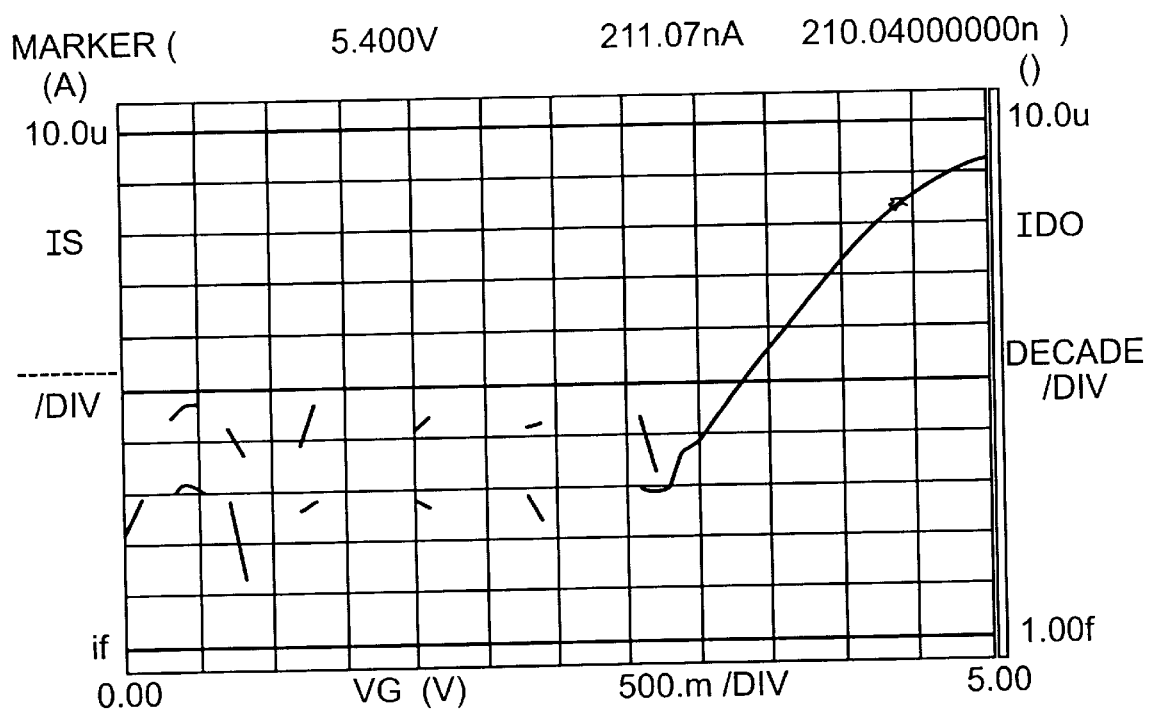
FIGS. 4–7 are illustrations of measurements taken during an example of a process consistent with the present invention.

FIG. 4 illustrates the operation of the cell when threshold is determined using a measurement. In FIG. 4, threshold occurs as $I_S$ begins to rise rapidly when $V_{CG}$ is increased. The discontinuous marks to the left of the increasing $I_S$, in FIG. 4 are products of the measurement resolution of the measuring device and the fabrication of the device. These marks can be ignored.

If the cell is operating in the subthreshold region, the drain current $I_D$ and source current $I_S$ are measured directly to determine whether the source-substrate junction has a large leakage current (Step 360). The above derived equations assume that all of the source current $I_S$ comes from the drain. If there is a parasitic leakage current to the source, then this assumption would be in error.

To determine if there is a large leakage amount, the absolute value of the difference of the currents $I_D$ and $I_S$ is checked to see if it exceeds a predetermined amount determined in accordance with a desired tolerance of the measurement. The ratio of the absolute value of the difference of currents $I_D$ and $I_S$ to the absolute value of $I_D$ is an error value $E_{RR}$. For a tolerance of about 3% defining a value $E_{RRI}$, then when $E_{RR}$ is less than $E_{RRI}$ the substrate current is tolerable, and when $E_{RR}$ is greater than $E_{RRI}$ the substrate current gives rise to an error value (step 370). If the absolute value is too large, the process is terminated and an error is indicated (Step 350).

Figure 5:
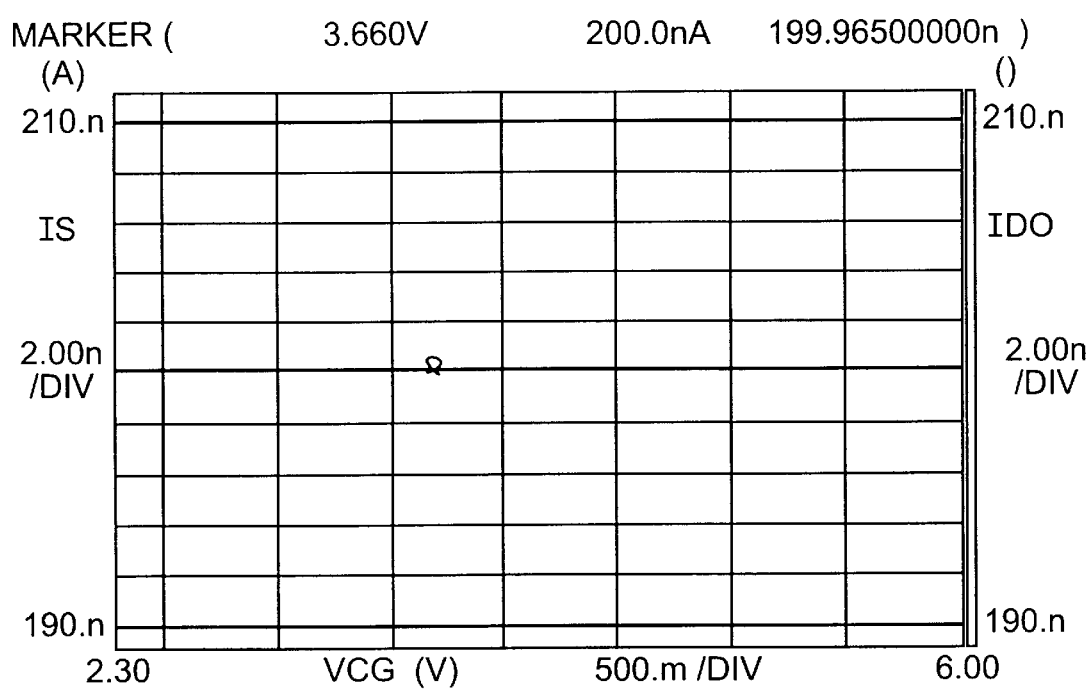

FIG. 5 shows a measurement of the source current and drain current in the experimental example. As shown in the legend of FIG. 5, the markers in FIG. 5, at $V_{CG}$ of 3.66V, show that the source current (199.966 nA) is substantially the same as the drain current (200 nA), which implies that the substrate current is negligible. Indeed, FIG. 5 barely shows a visible difference between the two current plots. Nevertheless, in the experimental example, the markers show that the value of the substrate current is a substantially constant 0.034 nA.

If the substrate current is negligible, the cell is placed in a reverse operation mode (Step 380). Positive current flows from the drain to the source, that is electrons move from the source to the drain, and the voltage on the source is of a higher potential than the voltage on the drain.

During the reverse operation mode, $I_S$ is set to a substantially constant value. In the experimental example, $I_S$ is a set to 200 nA, which is much larger than the substantially constant substrate current (0.034 nA). The control gate voltage is successively decreased by predetermined or variable increments, for example, from 5V to 1V in predetermined increments of 0.05V. In the experimental example, the sweep range is from 6V to 2.3V in increments of 0.05V. If $V_{CG}$ is swept in increasing magnitude, the initially low value of $V_{CG}$ would require that $V_S$ be set to a high value to create an inverted-charge channel and produce source current. This large $V_S$ could cause undesirable electron injection into the floating gate.

Because $I_S$ is substantially constant, the source voltage will increase. Accordingly, with reference to FIG. 3B and as shown by example in FIG. 6, a plot 610 of $V_{CG}$ versus $V_S$ can be generated (Step 410). In the constant slope region at plot 610, the cell is operating in the subthreshold region.

Figure 6:
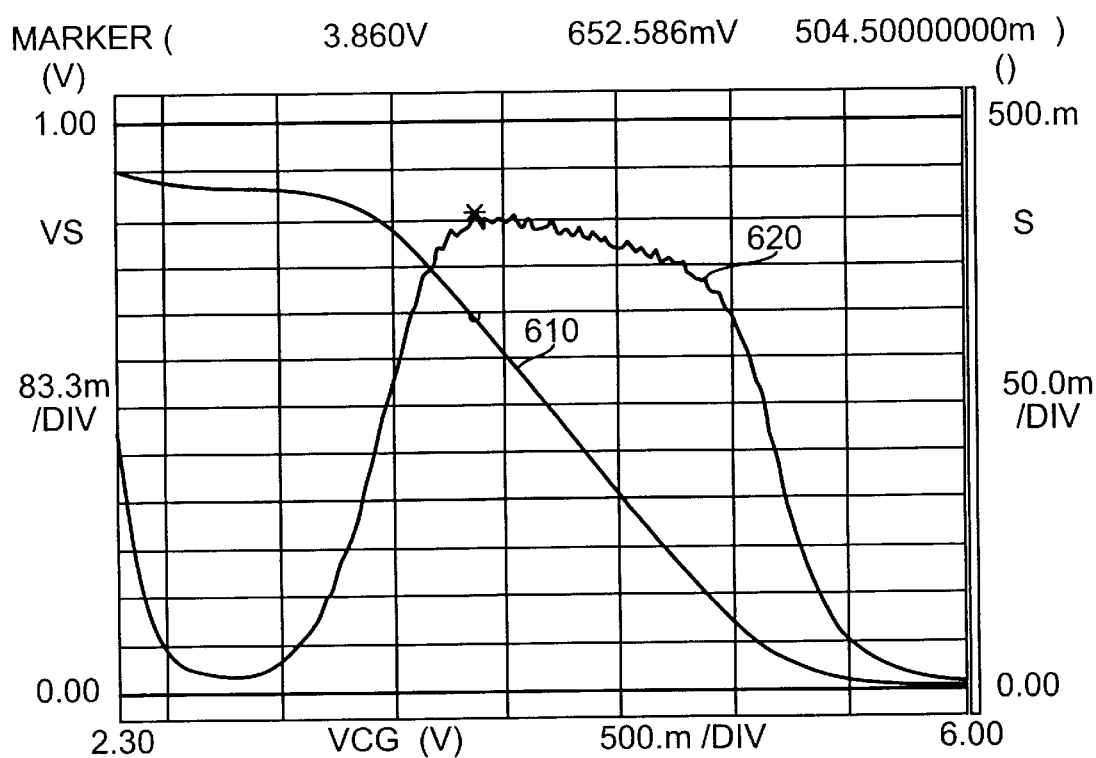
Figure 7:
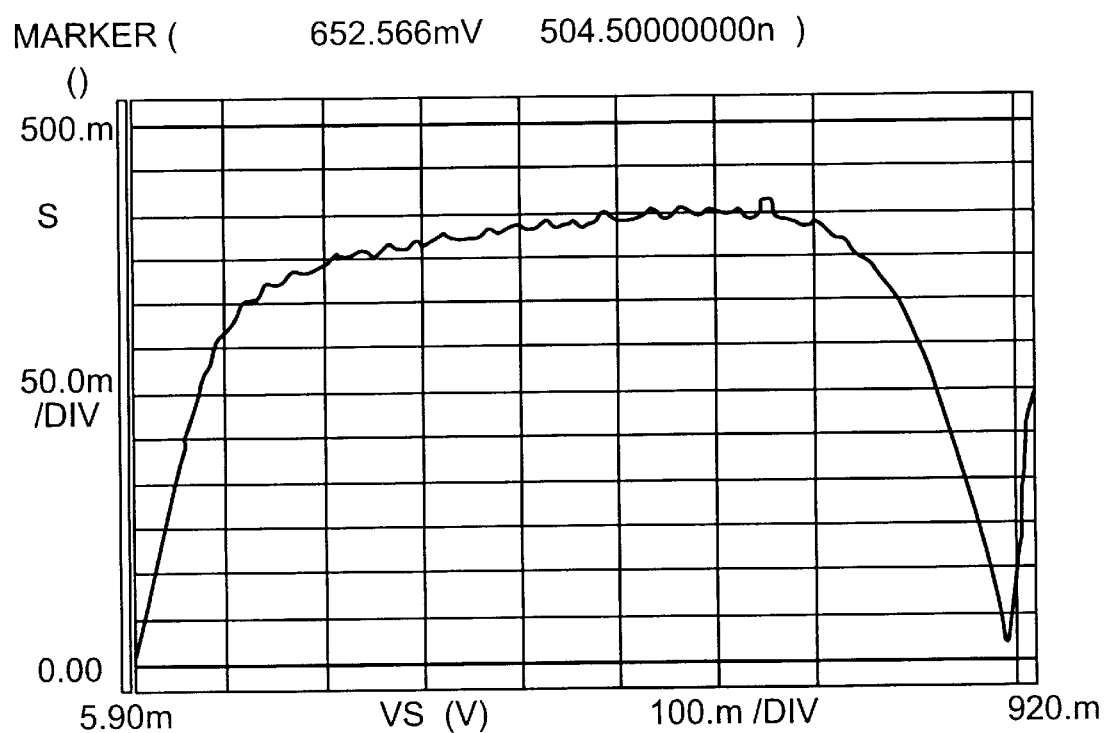

The slope, or differential, of plot 610 of FIG. 6 can be determined (Step 420). This slope reflects the value S. A plot 620 of S versus $V_{CG}$ is shown in FIG. 6. To test the assumption that S is merely weakly dependent on $V_S$, as shown by example in FIG. 7, a plot of S v. $V_S$ can be generated. As shown in FIG. 7, $S=f(V_S)$ increases as $V_S$ decreases because of the increase of capacitance $C_S$ caused by enlargement of the source depletion region.

Once S is determined, the coupling ratios $\alpha_G$ and $\alpha_S$ can be readily determined with reference to equations (2) and (6) above (Step 430).

To verify that only a small amount of charge is injected on the floating gate, that is, that the threshold voltage only shifts a small amount, a plot of $I_D$ v. $V_{CG}$ is generated (Step 440) and this measurement will confirm that threshold voltage shift due to floating gate charge is negligible. Because the above derived equations assume that the charge on the floating gate is substantially constant, if there is a large change, then this assumption would be in error.

The threshold voltage having been determined at step 440, the absolute value of differences of threshold voltages, for example the difference between a threshold voltage before the measurement and a threshold voltage manipulated by the method of the present invention, is checked to see if it exceeds a predetermined amount determined in accordance with a desired tolerance of the measurement (Step 450). If the absolute value is too large, e.g., greater than substantially 0.1V, the process is terminated and an error is indicated, because severe current injection onto the floating gate will occur (Step 350).

Once the coupling ratios are determined, the values are used in a modeling program, e.g., HSPICE, to design and manufacture an EEPROM. Use of prior art modeling techniques fails to provide accurate coupling ratio values, which means that the gate to source relationship cannot be depicted correctly resulting in failure of the circuit design. The more accurate model had from the method of this invention provides the exact load capacitance and resistence of the cell, which means the rise to fall time ratio of voltage swing for the next stage noise amplifier can be correctly considered resulting in an improved design and product.

It will be apparent to those skilled in the art that various modifications and variations can be made in the present invention and in construction of this device or the implementation of this process without departing from the scope or spirit of the invention. As an example, modeling the capacitance of electrodes of a ROM or other semiconductor device can also be accomplished.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method of determining characteristics of a split-gate memory cell, comprising:
    substantially fully charging a floating gate;
    measuring a parameter of the memory cell while the floating gate is substantially fully charged; and
    determining characteristics of the memory cell based on the measurement.

2. A method according to claim 1, wherein substantially fully charging the floating gate includes removing substantially all charge on the floating gate and, then, adding charge on the floating gate until the floating gate is substantially fully charged.

3. A method according to claim 1, wherein the measurement of the parameter includes measuring a control gate voltage relative to a source gate voltage.

4. A method according claim 1, wherein the determining of the characteristic includes determining a capacitance characteristic.

5. A memory cell designed using the determined characteristic of claim 1.

6. A memory cell array wherein each cell of the array is designed using the determined characteristic of claim 1.

7. A method of determining a characteristic of a split-gate memory cell, comprising:
    initializing the memory cell;
    placing the memory cell in a reverse operation mode;
    sweeping a control gate voltage of the cell;
    measuring a source voltage of the cell; and
    determining the characteristic of the memory cell.

8. A method according to claim 7, wherein the initializing comprises measuring a drain current of the cell relative to a control gate voltage of the cell; and measuring a source current of the cell relative to a control gate voltage of the cell and determining if the memory cell is in a subthreshold region; and if the memory cell is in a subthreshold region, comparing a drain current and a source current.

9. A method according to claim 7, further comprising:
    verifying whether the determination of the characteristic was validly performed.

10. A method according to claim 9, wherein the verifying includes determining a threshold voltage change.

11. A memory cell designed using the determined characteristic of claim 7.

12. A memory cell array wherein each cell of the array is designed using the determined characteristic of claim 7.

13. A method of determining two characteristics of a split-gate memory cell, comprising:
    defining a first function having three unknown variables, the two characteristics being two of the unknown variables;

defining a second function where only the two characteristics are unknown variables;

measuring a first device parameter relative to a second device parameter to determine the remaining unknown variable of the first function; and solving for the first function and second function using the measurement to determine the two characteristics.

14. A method according to claim 13, wherein the first function is:

$$S = \frac{\alpha_G}{\alpha_S}$$

where S is the remaining unknown variable, a coupling ratio $\alpha_G$ is one of the two characteristics, and a coupling ratio $\alpha_S$ is the other of the two characteristics, the coupling ratio $\alpha_G$ being a ratio of a floating gate capacitance to source electrode capacitance over a total floating gate capacitance, and the coupling ratio $\alpha_S$ being a ratio of a control electrode to floating gate capacitance over the total floating gate capacitance.

15. A method according to claim 14, wherein the second function is $\alpha_G + \alpha_S = 1$.

16. A method according to claim 15, wherein the first device parameter is a changing source voltage and the second device parameter is a changing control gate voltage, and the remaining unknown variable S is a ratio of the changing source voltage and the changing control gate voltage.

17. A memory cell designed using the determined characteristics of claim 13.

18. A memory cell array wherein each cell of the array is designed using the determined characteristics of claim 13.

19. A method of determining coupling ratios of a split-gate memory cell, comprising:

initializing the memory cell;

placing the memory cell in a reverse operation mode;

sweeping a control gate voltage of the cell;

measuring a source voltage of the cell; and determining the coupling ratios of the memory cell, wherein the coupling ratios are ratios of differing cell impedance values over a combined cell impedance value that includes the differing cell device impedance values.

20. A method according to claim 19, wherein a first coupling ratio is a ratio of a control electrode to floating gate capacitance over a total floating gate capacitance and a second coupling ratio is a ratio of a control electrode to floating gate capacitance over the total floating gate capacitance.

* * * * *